(12) United States Patent
Ludwicki et al.

(10) Patent No.: US 7,510,454 B2
(45) Date of Patent: Mar. 31, 2009

(54) OLED DEVICE WITH IMPROVED POWER CONSUMPTION

(75) Inventors: John E. Ludwicki, Churchville, NY (US); Michael L. Boroson, Rochester, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 452 days.

(21) Appl. No.: 11/334,866

(22) Filed: Jan. 19, 2006

(65) Prior Publication Data
US 2007/0164664 A1   Jul. 19, 2007

(51) Int. Cl.
*H01J 9/00* (2006.01)
(52) U.S. Cl. .......................... 445/23; 445/25
(58) Field of Classification Search ............. 445/23–25; 315/169.1, 169.3
See application file for complete search history.

(56) References Cited

U.S. PATENT DOCUMENTS

| | | | |
|---|---|---|---|
| 4,356,429 | A | 10/1982 | Tang |
| 5,550,066 | A | 8/1996 | Tang et al. |
| 6,281,634 | B1 | 8/2001 | Yokoyama |
| 6,456,013 | B1 | 9/2002 | Komiya et al. |
| 6,522,079 | B1 | 2/2003 | Yamada |
| 6,771,028 | B1 | 8/2004 | Winters |
| 2002/0186214 | A1 | 12/2002 | Siwinski |
| 2004/0113875 | A1 | 6/2004 | Miller et al. |
| 2004/0201558 | A1 | 10/2004 | Arnold et al. |

*Primary Examiner*—Joseph L Williams
(74) *Attorney, Agent, or Firm*—Raymond L. Owens (57) ABSTRACT

A method for making an OLED device, including: providing a plurality of subpixels of different colors, including at least three gamut-defining subpixels, each subpixel requiring an operating voltage which is based on the maximum current density required by that subpixel; selecting the display operating voltage to be equal to or greater than the maximum required subpixel operating voltage; and selecting the area of the subpixels to reduce the maximum required subpixel operating voltage, thereby reducing the display operating voltage so as to reduce power consumption in the device.

9 Claims, 10 Drawing Sheets

OLED DEVICE WITH IMPROVED POWER CONSUMPTION

FIELD OF THE INVENTION

The present invention relates to efficiently driving pixels in an active matrix OLED display.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons to cause light emission. These devices are also commonly referred to as organic light-emitting diodes, or OLEDs. A basic organic EL element is described in U.S. Pat. No. 4,356,429. In order to construct a pixelated OLED display that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a red, green, blue (RGB) display. For purposes of this disclosure, a pixel is considered the smallest individual unit capable of producing the full range of colors of the display. In a full color display, a pixel comprises several subpixels, which are the smallest individual units that can be independently stimulated to produce light. In the above RGB example, a single pixel will comprise a red subpixel, a green subpixel, and a blue subpixel.

Color OLED displays have also recently been described that are constructed as to have four different colored subpixels. One type of OLED display, known as an RGBW design, has four different colored subpixels that are red, green, blue, and white in color. Examples of such four-subpixel displays are shown in U.S. Pat. 6,771,028, U.S. Patent Application Publications 2002/0186214 A1, 2004/0113875 A1, and 2004/0201558 A1. Such RGBW displays can be constructed using a white organic EL emitting layer with red, green, and blue color filters for the red, green, and blue subpixels, respectively. The white subpixel area is left unfiltered. This design has the advantage that the organic electroluminescent media does not require patterning between the different colored subpixels, thereby simplifying the manufacturing process. Furthermore, the white subpixel allows reduced power consumption to display less-than-fully-saturated colors, when compared to displays having a white organic EL emitting layer with only red, green, and blue subpixels.

OLED displays driven with active matrix circuitry have also been shown. Active matrix circuitry typically includes active circuit components such as multiple transistors and one or more capacitors per subpixel, as well as signal lines such as data, scan, and power lines, which are shared by the subpixels of a row or column. Each subpixel in an active matrix OLED display is provided with at least one power transistor, which regulates current flow to the organic EL element in response to a data signal. The power transistor draws current from a power line, which is electrically connected to a voltage source. This current is passed to the first electrode and the organic EL media of the subpixel's organic EL element. The second electrode, which is disposed above the organic EL media and the active matrix circuitry, is electrically connected to a second voltage source, which completes the current path. Examples of organic EL displays driven by active matrix circuitry are shown in U.S. Pat. Nos. 5,550,066; 6,281,634, and 6,456,013.

In active-matrix OLED displays, the voltage difference between the voltage source connected to the power line and that connected to the second electrode is sufficient to power all the connected subpixels at their greatest luminance. This voltage difference, or drop, is split between the organic EL element and the power transistor. Therefore, when subpixels are operated at lower intensity, the supplied voltage is in excess and the percentage voltage drop across the power transistors increases. Since power consumption is the product of current flow and voltage drop, this extra voltage drop results in reduced power efficiency.

Active matrix OLED displays have been shown where different colored subpixels are connected to the same power line, e.g. U.S. Pat. No. 6,456,013. Also, active matrix OLED displays have been shown where adjacent columns of subpixels share the same power line in U.S. Pat. No. 6,522,079. Similarly, examples where the same power line is shared by subpixels of differing colors or subpixels in adjacent rows for an RGBW type active matrix display are shown in U.S. Pat. No. 6,771,028. However, such different colored subpixels frequently have different maximum voltage levels. In such displays, the voltage is commonly set at a level to drive the most demanding subpixels, resulting in poor power efficiency.

SUMMARY OF THE INVENTION

It is therefore an object of the present invention to provide an OLED display with improved power efficiency.

This object is achieved by a method for making an OLED device, comprising:

(a) providing a plurality of subpixels of different colors, including at least three gamut-defining subpixels, each subpixel requiring an operating voltage which is based on the maximum current density required by that subpixel;

(b) selecting the display operating voltage to be equal to or greater than the maximum required subpixel operating voltage; and (c) selecting the area of the subpixels to reduce the maximum required subpixel operating voltage, thereby reducing the display operating voltage so as to reduce power consumption in the device.

It is an advantage of this invention that it provides an OLED device with better power efficiency, leading to lower overall power consumption for the device. It is a further advantage of some embodiments of this invention that the lifetime of the device can be increased. It is a further advantage of this invention that it can contribute to color balance over the lifetime of the device.

BRIEF DESCRIPTION OF THE DRAWINGS

FIG. 7b shows the average and peak current densities for the different colored subpixels for the device with required subpixel and display operating voltages of FIG. 7a;

FIG. 7c shows the estimated subpixel and display lifetimes for the device with required subpixel and display operating voltages of FIG. 7a;

FIG. 8b shows the average and peak current densities for the different colored subpixels for the device with required subpixel and display operating voltages of FIG. 8a;

FIG. 8c shows the estimated subpixel and display lifetimes for the device with required subpixel and display operating voltages of FIG. 8a;

FIG. 9b shows the average and peak current densities for the different colored subpixels for the device with required subpixel and display operating voltages of FIG. 9a;

FIG. 9c shows the estimated subpixel and display lifetimes for the device with required subpixel and display operating voltages of FIG. 9a.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED display" or "organic light-emitting display" is used in its art-recognized meaning of a display device comprising organic light-emitting diodes (OLED) as pixels. A color OLED display emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in several regions of the visible spectrum and creating mixtures of these colors. Various mixtures of the multicolor emitters therefore provide the impression of a large combination of hues. In general, red, green, and blue colors constitute three primary colors from which many other colors can be generated by appropriate mixing. However, for this invention, full color can include additional different color emitters. The term "pixel" is employed to designate the smallest area of a display panel that can produce the full gamut of colors of which the display is capable. In full color systems, a pixel will comprise several subpixels of different colors, each of which can be stimulated to emit light independently of the others. For example, in a three-color RGB full color display, a pixel generally comprises three primary-color subpixels, namely red, green, and blue (RGB). For the purposes of this invention, the term "OLED device" will also be used to refer to a pixel.

Figure 1:
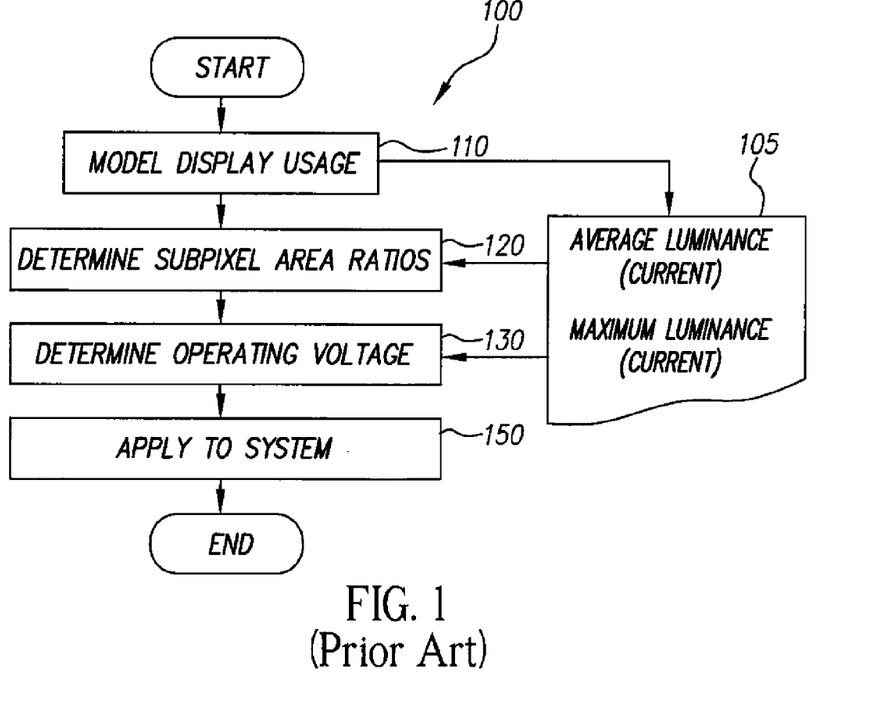
FIG. 1 shows a prior art method of determining the current density, subpixel area ratios, and operating voltage for an OLED device.

Turning now to FIG. 1, there is shown a prior art method of determining the current density, subpixel area ratios, and operating voltage for an OLED device. At the start of method 100, the display usage of the OLED device is modeled (Step 110) based on expected usage of the particular device. Modeling provides the expected average luminance and peak or maximum luminance for the different colored subpixels (output block 105). Luminance, and thus intensity, correlates with current through the OLED devices in an approximately linear fashion. Modeling thus provides an estimate of average current and maximum current for the different colored subpixels of the OLED device. Current density is related to current for a given subpixel area, and thus modeling also provides an estimate of average current density and maximum current density. The OLED subpixels of different colors can be sized to balance their average lifetimes (Step 120). The lifetime estimates are based on display usage data and lifetime data for the OLED material at various current densities. Often, an OLED device is determined to have reached the end of its useful life when it reaches 50% of its original luminance, but any other criteria can be used to determine the end of useful life, such as 75% luminance or degree of color shift. Typically, an OLED material ages faster at higher current densities. One method to approximate the age of a subpixel is to determine the average current density of the subpixel and use the aging data for that current density to estimate the subpixel's life. More sophisticated methods use the probability of the subpixel operating at a large number of current densities and then determine the lifetime of the subpixel using aging data associated with each of the current densities for which probability data is collected. In either case, the useful lifetime of the display is often determined by the subpixel with the shortest lifetime, but other methods can also be used.

Figure 2A:
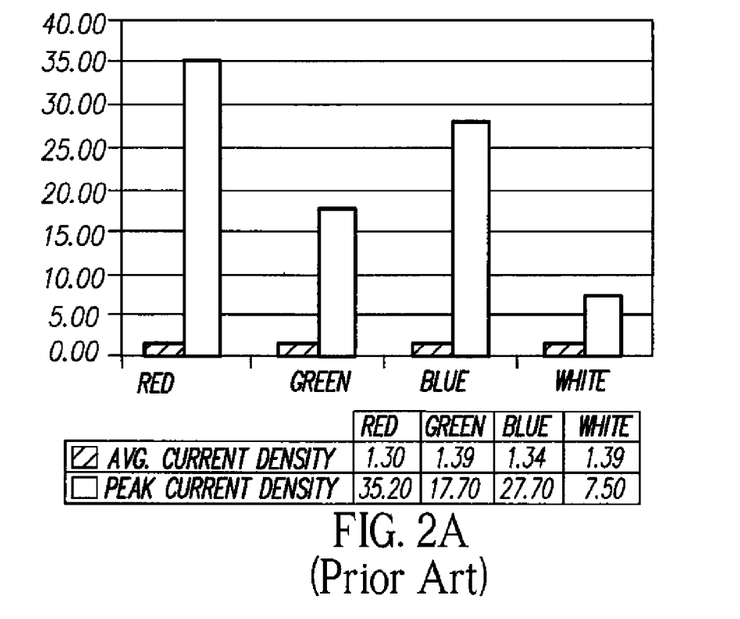
FIG. 2a shows the average and peak current densities for the different colored subpixels of an RGBW OLED device when adjusted by the above prior art method.
Figure 2B:
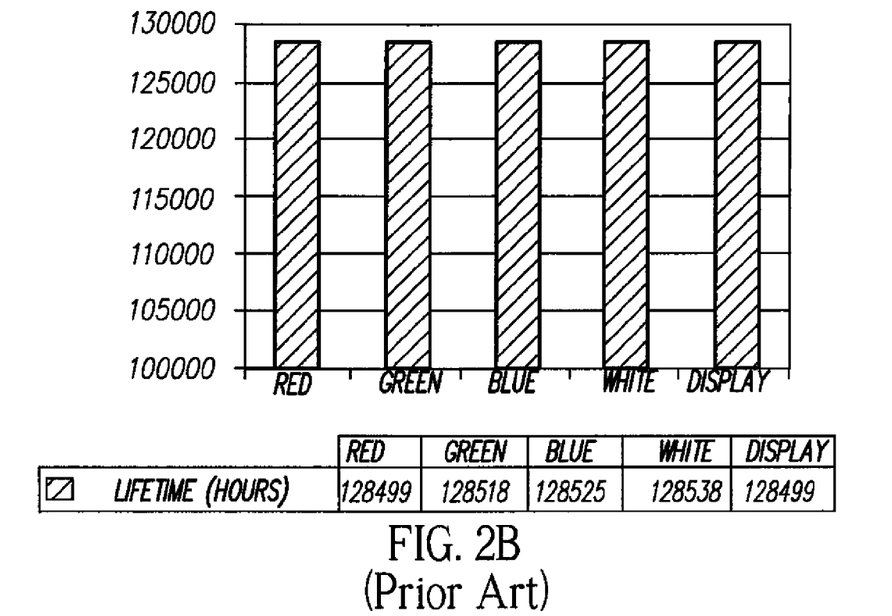
FIG. 2b shows the estimated subpixel and display lifetimes for an RGBW OLED device as determined by the above prior art method.

In a device with a filtered common (e.g. white) emitter, the same emitting materials and layers are used for all the subpixels. Therefore, the lifetimes of the subpixels can be loosely balanced by balancing the average current densities of the individual colored subpixels. FIG. 2a shows the average and peak current densities for the different colored subpixels of an RGBW device when subpixel areas are adjusted to balance lifetime. FIG. 2b shows the estimated average lifetime for the different colored subpixels and the device itself.

Figure 2C:
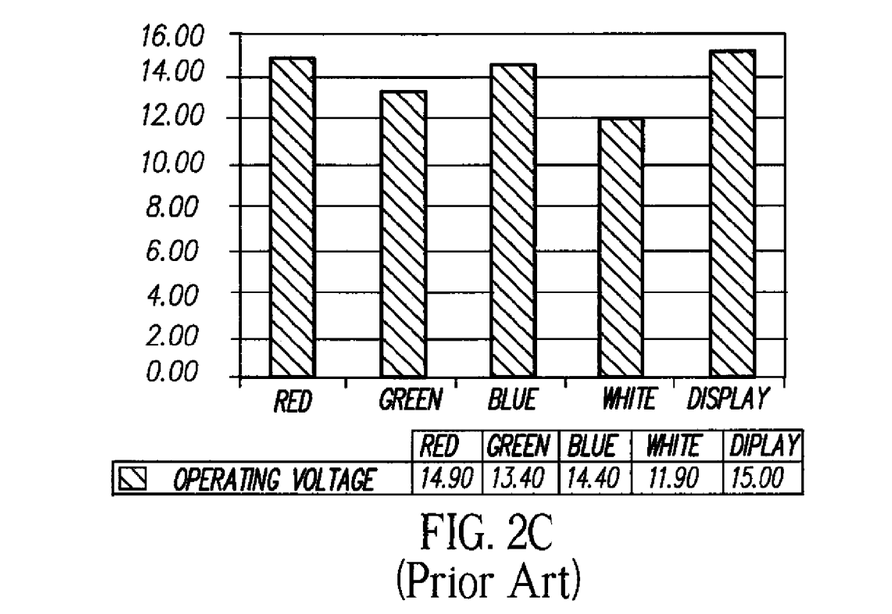
FIG. 2c shows the required subpixel and display operating voltages for an RGBW OLED device as determined by the above prior art method.
Figure 3:
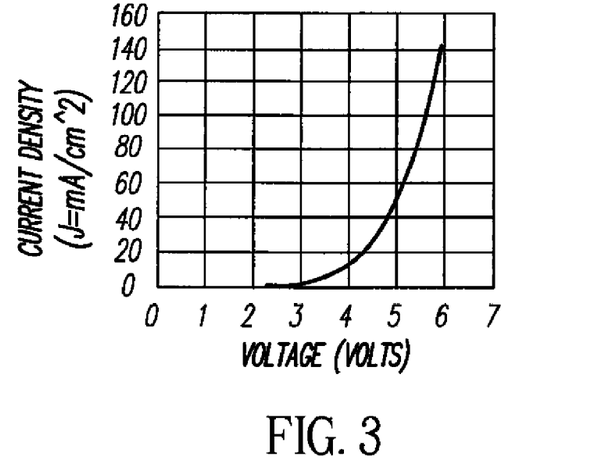
FIG. 3 shows a plot of current density vs. voltage for a typical OLED device.

Each subpixel requires a voltage that must be provided between first and second electrodes (described below) based on the maximum current density required by that subpixel. This is herein called the subpixel operating voltage because it is the minimum voltage that can produce the full luminance range of a given subpixel. The required subpixel operating voltage can be determined (Step 130) from the maximum current density via a plot of current density vs. voltage for a given OLED device. FIG. 3 is an example of such a plot. For example, to provide a maximum current density of 100 ma/cm$^2$, the voltage must be at least 5.5 volts, plus voltage required to operate the other components in the circuit and to compensate for aging. FIG. 2c shows the required subpixel and display operating voltages for the device. The display operating voltage is herein defined as the minimum voltage that can produce the full luminance range of all subpixels in the display. Therefore, the display operating voltage necessary to drive the OLED device must be selected to be equal to or greater than the maximum required subpixel operating voltage—in this example, red. The findings can be applied to an OLED device (Step 150) by fabricating the device with the desired subpixel sizes and voltage supply. However, if one or more of the subpixels requires a disproportionately high operating voltage relative to the other subpixels, the OLED device will have significantly higher power requirements because the voltage is directly proportional to the amount of power required to drive the OLED device.

The method described herein can be used with a variety of OLED devices that are known in the art. The OLED device includes a plurality of subpixels of different colors, including at least three gamut-defining subpixels. The term gamut-defining subpixels means subpixels emitting different colors whose light can be combined in different ratios to display a wide variety of colors. A common set of gamut-defining subpixels includes red, green, and blue subpixels. However, this method can be used with OLED devices that include subpixels of other colors. This method can also be used with OLED devices that include four or more subpixels. For example, Boroson et al. in U.S. Patent Application Publication 2005/0225232, the disclosure of which is incorporated by reference, describes OLED devices with four (or more) gamut-defining subpixels. Further, OLED devices with at least three gamut-defining subpixels and at least one within-gamut subpixel are known in the art and can be used with this method. The within-gamut subpixel is commonly a white-light-emitting subpixel, but within-gamut subpixels of other colors can be used. A preferred embodiment of OLED device for which this method can be used is that wherein a broadband emitter is common to all subpixels and the color of the individual subpixels can be selected by e.g. color filters or color change modules. However, this method is not limited to those devices and can be used with OLED devices wherein the different-colored subpixels are patterned with different emitters.

Figure 4A:
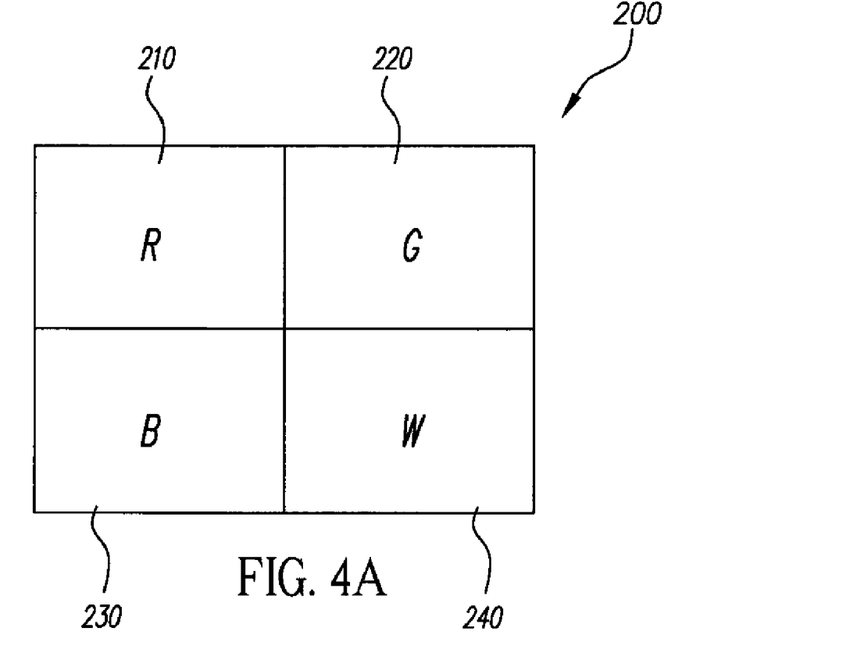
FIG. 4a shows a plan view of one embodiment of an OLED device with three different colored gamut-defining subpixels and one within-gamut subpixel of equal area.
Figure 10:
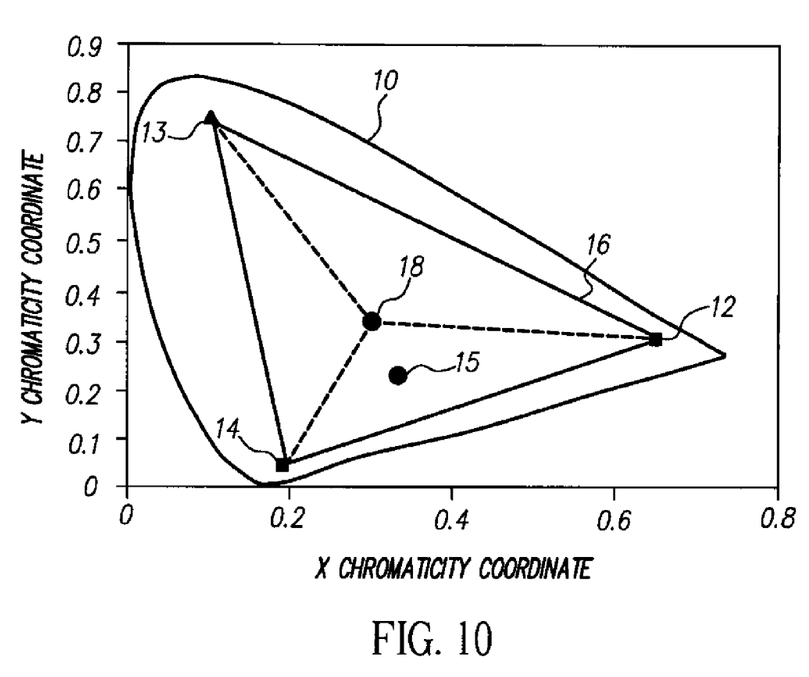
FIG. 10 shows schematically the color gamut.

Turning now to FIG. 4a, there is shown a plan view of one embodiment of an OLED device that provides a plurality of subpixels of different colors, including three different colored gamut-defining subpixels and one within-gamut subpixel, all of equal area. OLED device 200 includes red subpixel 210, green subpixel 220, blue subpixel 230, all of which are gamut-defining subpixels, and white subpixel 240, which is a within-gamut subpixel. The color gamut is shown schematically in FIG. 10, which is a 1931 CIE (Commission Internationale d'Éclairage) x,y-chromaticity diagram of a light-emitting device with three color-gamut-defining subpixels and one within-gamut subpixel. At least three gamut-defining subpixels emit different colors, e.g. red emitter 12, green emitter 13, and blue emitter 14, which correspond to the above gamut-defining pixels and emit red, green, and blue light, respectively, and which define the color gamut 16 of the display in CIE color space 10. By illuminating two or more of the color-gamut-defining subpixels to varying intensities, other colors can be generated. These new colors are within-gamut colors. Such a display device also has at least one additional within-gamut subpixel that emits a within-gamut color light, e.g. white emitter 18 that emits white light. The term "white" is used in the present invention to indicate any light emission which is perceived as approximately white to a viewer. The within-gamut subpixel, however can be any color within the gamut of the color-gamut-defining subpixels and the term "RGBW" is used herein to describe any display having at least three color-gamut-defining subpixels and at least one within-gamut subpixel. This type of display is more efficient than conventional OLED displays because the within-gamut subpixels tend to have higher efficiency than at least one of the color-gamut-defining subpixels. Typically, the within-gamut subpixel is more efficient than all of the color-gamut-defining subpixels.

In this configuration, the added emitter creates a series of sub-gamuts (shown by the dashed lines in FIG. 10) including white emitter 18 and two of the other three emitters. The sub-gamuts together form color gamut 16. Thus, while one can generate a desired color 15 from an appropriate combination of red emitter 12, green emitter 13, and blue emitter 14, it can be more efficient to generate it by an appropriate combination of red emitter 12, blue emitter 14, and white emitter 18.

All of the subpixels of OLED device 200 have equal area. However, as described above, if the average luminance demands of the subpixels are different, this arrangement can lead to unequal usage, and therefore unequal lifetimes, for the different colored subpixels.

Figure 4B:
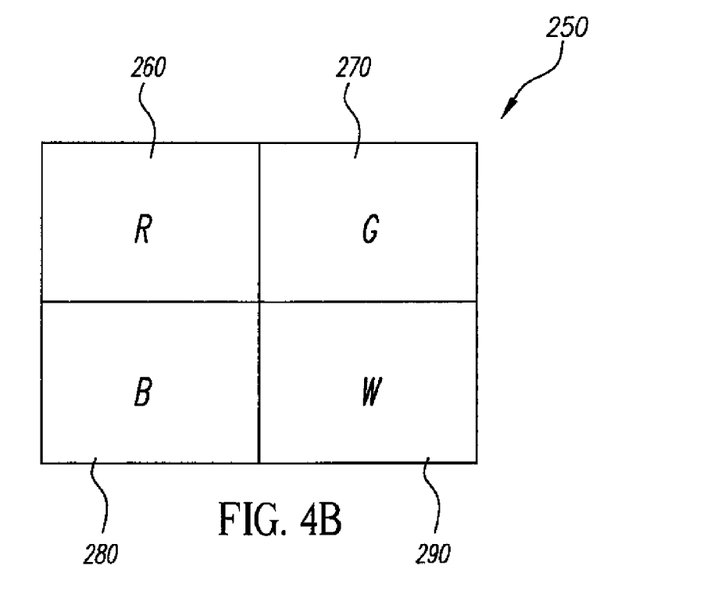
FIG. 4b shows a plan view of an embodiment of an OLED device with three different colored gamut-defining subpixels and one within-gamut subpixel in which the areas have been adjusted in accordance with this invention.

Turning now to FIG. 4b, there is shown a plan view of an embodiment of an OLED device with three different colored gamut-defining subpixels and one within-gamut subpixel wherein the areas of the subpixels have been selected to adjust the initial current density, as determined above, to reduce the display operating voltage so as to reduce power consumption in the device as will be described by the method of this invention. Red subpixel 260, green subpixel 270, blue subpixel 280, and white subpixel 290 of OLED device 250 have different areas.

Figure 5:
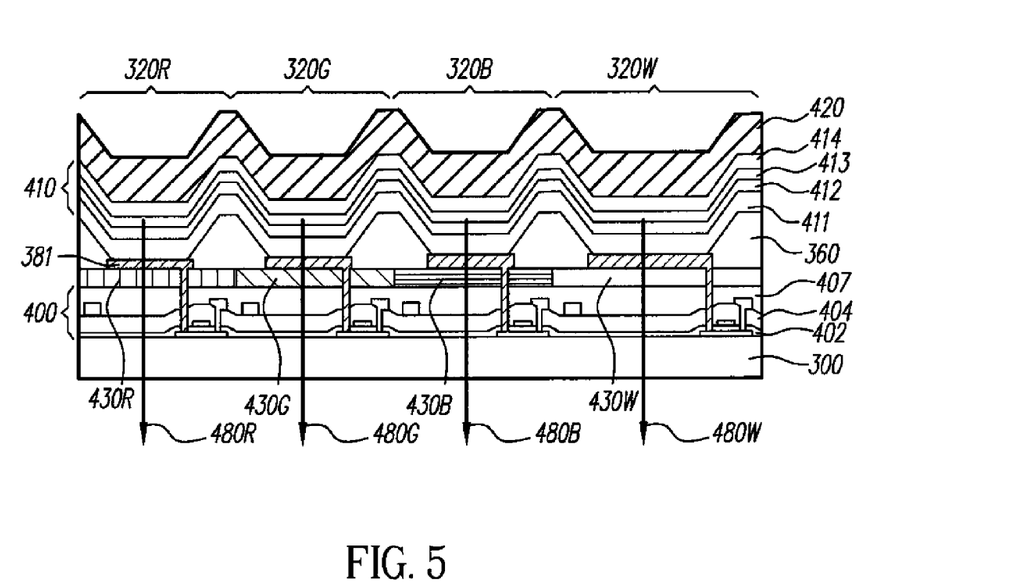
FIG. 5 shows a cross-sectional view of an OLED device with three different colored gamut-defining subpixels and one within-gamut subpixel.

A cross-sectional view illustrating the vertical arrangement of the various layers of an OLED display is shown in FIG. 5. From FIG. 5, it can be seen that subpixel 320r, subpixel 320g, subpixel 320b, and subpixel 320w are formed above substrate 300. When electrically stimulated, these subpixels produce red light 480r, green light 480g, blue light 480b, and white light 480w, respectively. Active matrix circuitry layers 400, including insulating layer 402, insulating layer 404, and insulating layer 407 are shown. The formation of the interpixel dielectric layer 360 over the edges of the first electrodes, such as first electrode 381, can also be seen. In the case where light is viewed through the substrate, as shown, these first electrodes are preferably constructed of a material that is highly transparent such as indium tin oxide or indium zinc oxide. However, the present invention is not limited to this configuration, and one can construct devices that emit in the opposite direction. In the latter case, the first electrodes are preferably constructed of a reflective material, such as aluminum or silver.

Each of the pixels further includes a portion of organic EL media 410. There are numerous configurations of the organic EL media 410 layers wherein the present invention can be successfully practiced. In one configuration, the OLED device can be a white-light-emitting OLED device wherein a broadband or white light source that emits light at the wavelengths used by all the pixels can be used to avoid the need for patterning the organic EL media between pixels. The gamut-defining subpixels in this configuration can each include a color filter, such as red color filter 430r, green color filter 430g, and blue color filter 430b in the light path so as to provide the red, green, and blue light from the white or broadband emission. Subpixels that are to emit the same white or broadband emission as the organic EL media, such as subpixel 320w, can remain unfiltered. In this case, a transparent filter 430w can optionally be provided in place of a color filter. Alternately, the present invention can also be successfully practiced without providing a transparent filler material or color filter for the within-gamut pixel. Some examples of organic EL media layers that emit broadband or white light are described, for example, in U.S. Pat. No. 6,696,177. However, the present invention can also be made to work where each subpixel has one or more of the organic EL media layers separately patterned for each subpixel to emit differing colors for specific pixels. The organic EL media 410 is constructed of several layers such as: a hole-injecting layer 411, a hole-transporting layer 412 that is disposed over hole-injecting layer 411, an organic light-emitting layer 413 disposed over hole-transporting layer 412, and an electron-transporting layer 414 disposed over light-emitting layer 413. Alternate constructions of the organic EL media 410 having fewer or more layers can also be used to successfully practice the present invention. Organic EL media layers applied in the opposite order are also known in the art and can be applied to the present invention. These organic EL media layers include organic materials that are either small molecule materials or polymer materials as are known in the art. These organic EL media layers can be deposited by one or more of several methods known in the art such as, for example, thermal evaporation in a vacuum chamber, laser transfer from a donor substrate, deposition from a solvent by spin coating, or use of an ink-jet print apparatus.

Above the organic EL media 410, a second electrode 420 is formed. For a configuration where the light is viewed through the substrate, as shown, this electrode is preferably highly reflective and can be composed of a metal such as aluminum, silver, or magnesium/silver alloy. However, in an alternate embodiment where the light is viewed in the opposite direction, this electrode should be highly transparent and constructed of thin metals, such as silver with a thickness less than 25 nm, or transparent conductive oxides such as indium tin oxide or indium zinc oxide, or combinations thereof. The second electrode 420 can also include an electron-injecting layer (not shown) composed of a material such as lithium to aid in the injection of electrons. When a region of organic EL media 410 is stimulated by an electrical current between a first electrode, such as first electrode 381, and second electrode 420, the region of organic EL media 410 produces light emission.

Most OLED displays are sensitive to moisture or oxygen, or both, so they are commonly sealed with an encapsulating structure (not shown) in an inert atmosphere such as nitrogen or argon using metal or glass covers. Such encapsulation can further include a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation and can be applied to the present invention by one skilled in the art.

Figure 6:
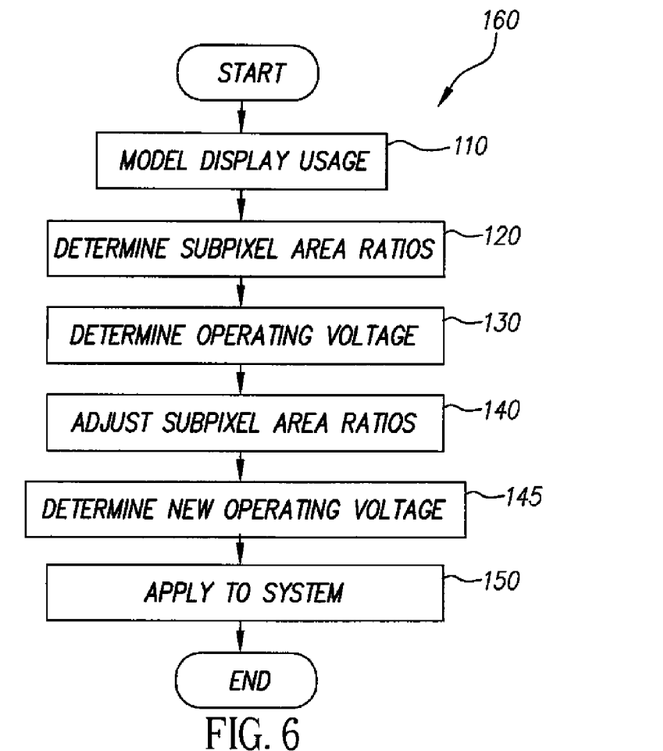
FIG. 6 shows a method according to the present invention of determining the current density, subpixel area ratios, and operating voltage for an OLED device, and further adjusting the OLED device to improve the operating voltage.

Turning now to FIG. 6, there is shown one embodiment of a method according to the present invention for determining the current density, subpixel area ratios, and display operating voltage in making an OLED device, and further adjusting the OLED device to improve the display operating voltage requirements. The first three steps of method 160 are similar to those of method 100 of FIG. 1. At the start, the display usage of the OLED device is modeled (Step 110) based on expected usage of the particular device to provide the expected average luminance and current density, and maximum luminance and current density, for the different colored subpixels. The initial OLED pixels of different colors can be sized to balance their average lifetimes (Step 120). The required subpixel operating voltage can be determined (Step 130) from the maximum current density via a plot of current density vs. voltage for a given OLED device. This gives required subpixel operating voltages for each of the different colored subpixels.

Figure 7A:
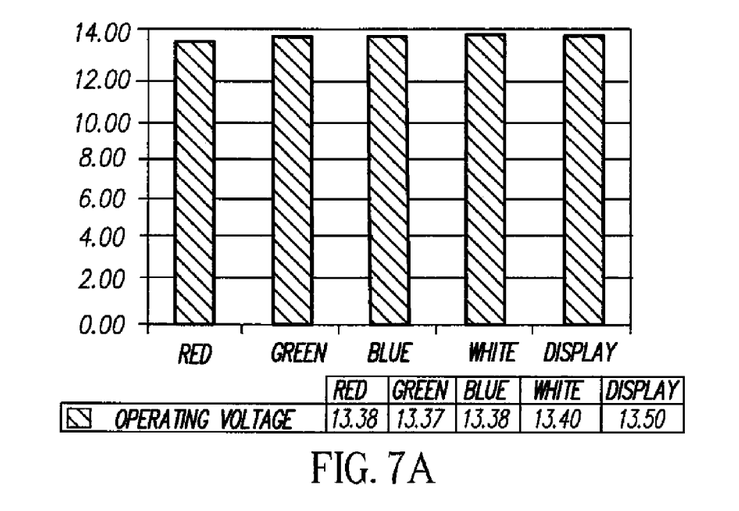
FIG. 7a shows the required subpixel and display operating voltages for an RGBW device as determined by one embodiment of the above inventive method.

An example of such subpixel operating voltages was shown in FIG. 2c. To reduce the display operating voltage (that is, for the entire device), one must reduce the maximum required subpixel operating voltage, which in this case is for the red subpixel and to a lesser extent the blue. To reduce the required subpixel operating voltage, one must reduce the current density according to a graph such as that of FIG. 3. The subpixel area ratios can be selected (Step 140) to balance the maximum current densities. In the case in FIG. 2c, for example, the white subpixel can be made smaller, while the red and blue subpixels are enlarged. The required subpixel and display operating voltages can be determined for the different colored area-adjusted subpixels (Step 145), as shown in FIG. 7a. This shows that selecting the area of the subpixels in this way reduces the maximum required subpixel operating voltage by 1.5 volts, which thereby reduces the display operating voltage so as to reduce power consumption in the device. Steps 140 and 145 can be repeated, but iterative application is not required for the successful application of this invention. The findings can be applied to the system (Step 150) by fabricating the desired OLED device.

Figure 7B:
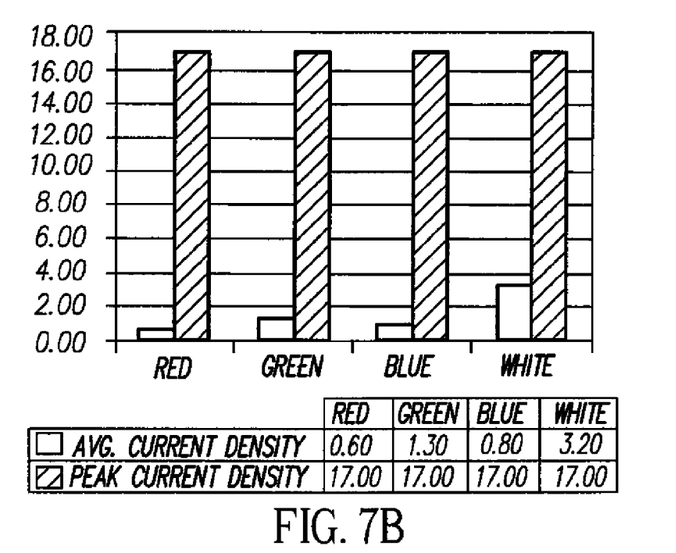
Figure 7C:
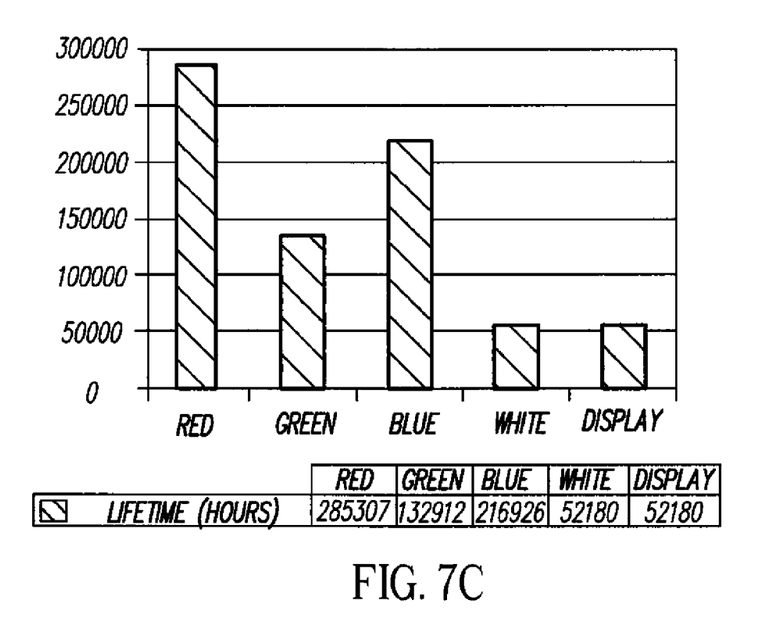

Turning now to FIG. 7b, there is shown an example of the average and peak current densities for the different colored subpixels with the subpixel operating voltages of FIG. 7a. Because the area of the white subpixel has been decreased, its average current density has increased. Likewise, the average current densities of the red and blue subpixels have decreased, though not equally, because the areas have increased. This means that over time, the different colored subpixels can age at different rates, which can lead to effects such as hue changes in the display. The lifetime estimates in FIG. 7c show the potential for differential aging of the subpixels. While differential aging is often undesirable, it can be an acceptable trade-off in cases where low power consumption is a paramount consideration.

Figure 8A:
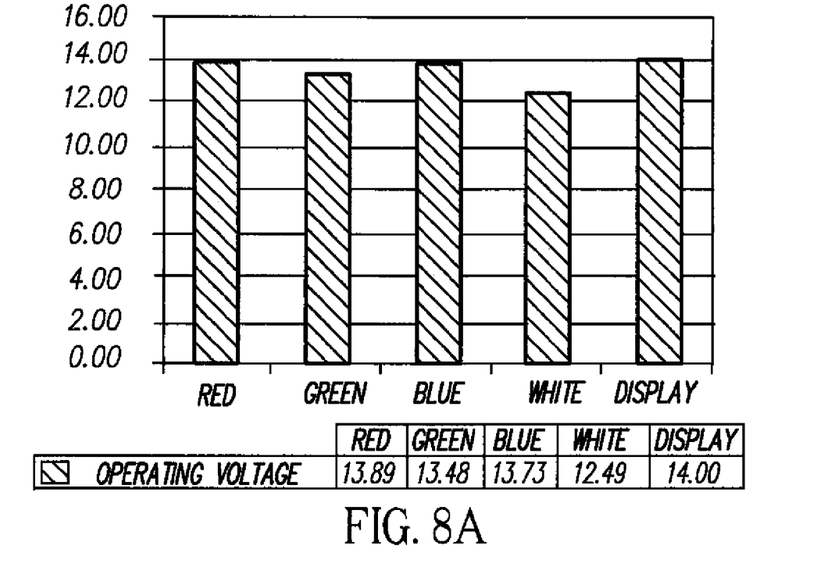
FIG. 8a shows the required subpixel and display operating voltages for an RGBW device as determined by another embodiment of the above inventive method.
Figure 8B:
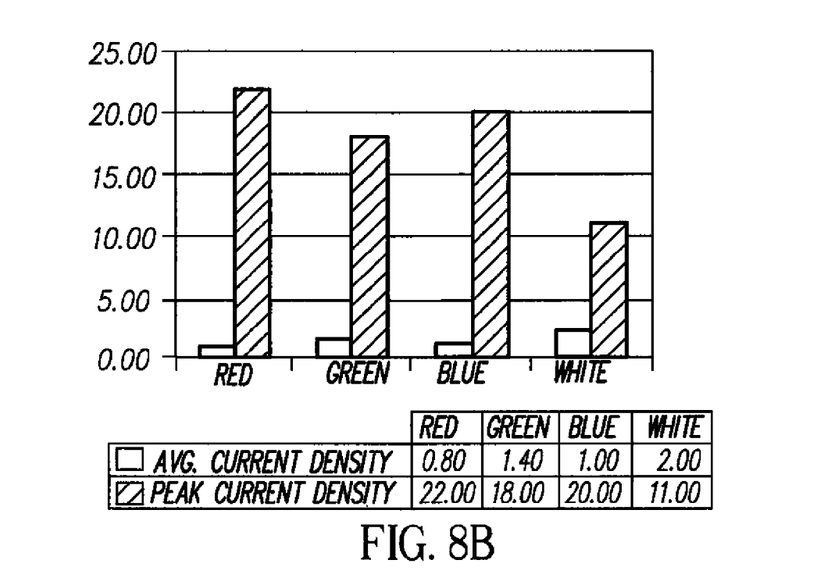
Figure 8C:
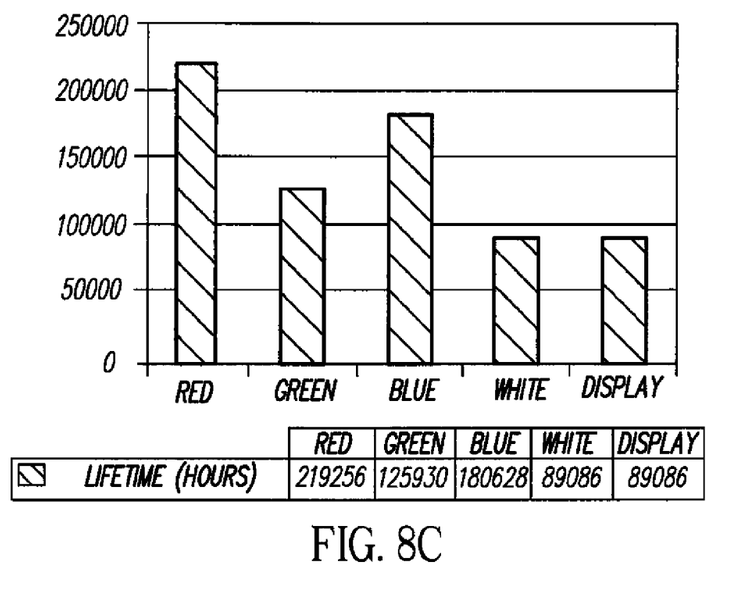

Turning now to FIG. 8a, there is shown the required subpixel and display operating voltages for an RGBW OLED device as determined by another embodiment of the above inventive method. In this embodiment, the area of the subpixels has been selected to reduce the maximum required subpixel operating voltage, and further selected (as a secondary goal) to improve the lifetime relative to the embodiment of FIG. 7a to 7c. In this case, relative to that of FIG. 2c, the red and blue subpixel areas have been increased and the white subpixel area has been decreased. Thus, the maximum current densities and subpixel operating voltages of the red and blue subpixels have been lowered to be nearer to—but not identical to—the values for the green subpixel, while those of the white subpixel have increased. The result is a decrease in the display operating voltage and a power savings for the overall OLED device, although the power savings is not as great as in the embodiment of FIG. 7a. Using this method, some power savings can be garnered with less of an effect on the lifetime of the device. FIG. 8b shows the average and peak current densities for the different colored subpixels with the subpixel operating voltages of FIG. 8a. As in FIG. 7b, the area of the white subpixel has been decreased and its average current density has increased. Likewise, the average current density of the red and blue subpixels have decreased. However, the average current density of the green subpixel has not changed. This means that, as in the case of the embodiment of FIG. 7b, the different colored subpixels can age at different rates, which can lead to effects such as hue changes in the display. The lifetime estimates in FIG. 8c show the potential for differential aging of the subpixels. The overall lifetime of the display is less affected in this embodiment as compared to FIG. 7c.

Figure 9A:
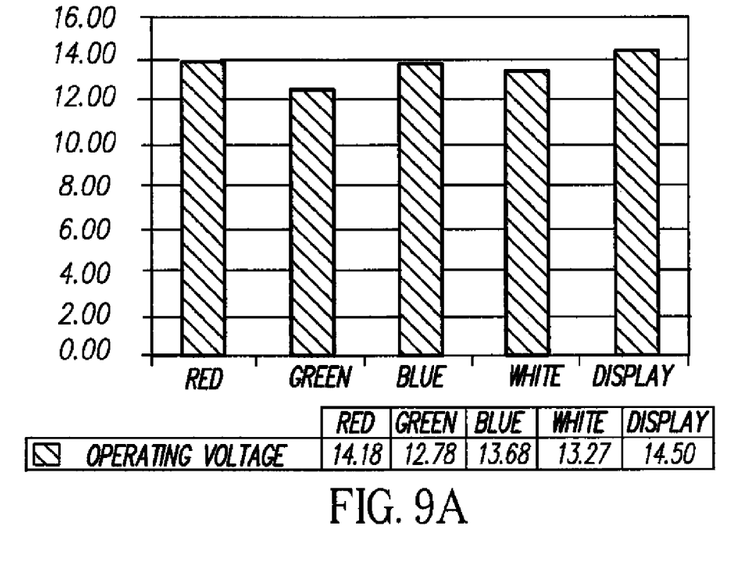
FIG. 9a shows the required subpixel and display operating voltages for an RGBW device as determined by another embodiment of the above inventive method.
Figure 9B:
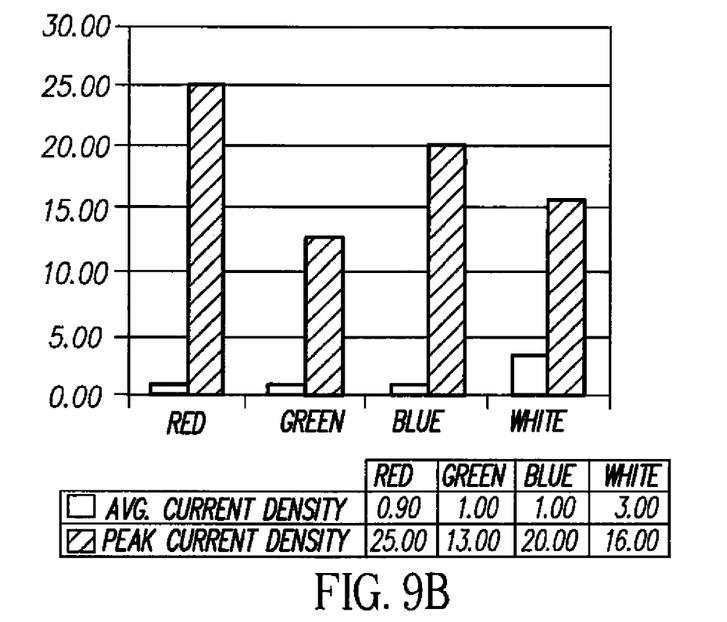
Figure 9C:
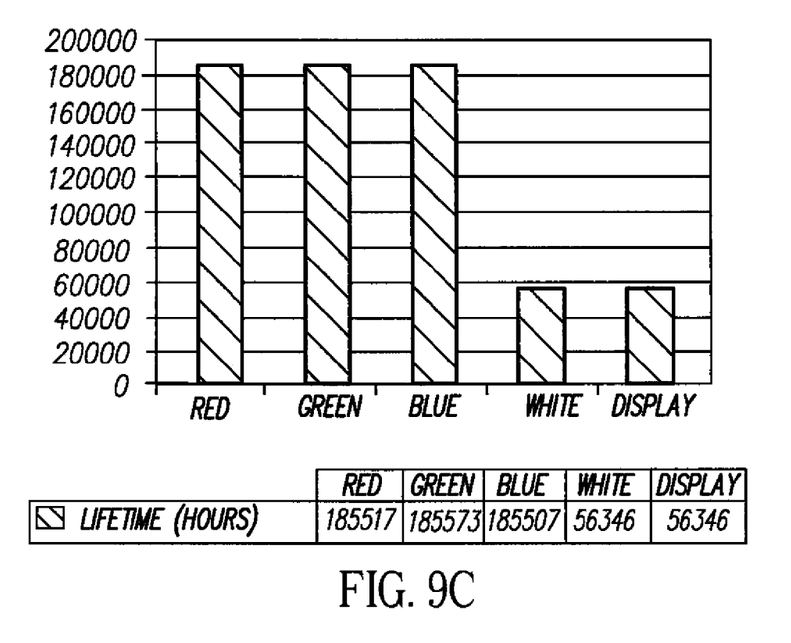

Turning now to FIG. 9a, there is shown the required subpixel and display operating voltages for an RGBW OLED device as determined by another embodiment of the above inventive method. In this embodiment, the areas of the gamut-defining subpixels have been selected so that they have similar lifetimes, while the within-gamut pixel has an area selected to reduce the maximum required subpixel operating voltage. Relative to the device of FIG. 2a, the area of the white subpixel has been reduced, which increases the subpixel operating voltage for the white subpixel. The areas of the red, green, and blue subpixels have each been increased, and the percentage increase is the same for each of the red, green, and blue subpixels, which decreases the subpixel operating voltages for the gamut-defining subpixels. The maximum benefit is obtained when the subpixel operating voltage for the white subpixel and the maximum subpixel operating voltage (red in this example) approach each other. The result is to reduce the display operating voltage so as to reduce power consumption in the overall OLED device, although the power savings is not as great as in the embodiment of FIG. 7a. FIG. 9b shows the average and peak current densities for the different colored subpixels with the subpixel operating voltages of FIG. 9a. As in FIG. 7b, the area of the white subpixel has been decreased and its average current density has increased. However, the average current densities of all of the gamut-defining subpixels have decreased by the same percentage relative to each other. This means that while the white subpixel can age at a different rate from the gamut-defining subpixels, the red, green, and blue subpixels should age at approximately the same rate. Thus, while aging can produce changes in the overall luminance of such an OLED display, it will be much less likely to cause hue changes, which are more noticeable. Therefore, this embodiment shows power savings while not showing undesirable color changes to the display. Thus, in this embodiment, the areas of the subpixels have been selected to reduce the display operating voltage and further selected to improve lifetime. The lifetime estimates shown in FIG. 9c show these effects.

The invention has been described in detail with particular reference to certain preferred embodiments thereof, but it will be understood that variations and modifications can be effected within the spirit and scope of the invention.

PARTS LIST

10 CIE color space
12 red emitter
13 green emitter
14 blue emitter
15 desired color
16 color gamut
18 white emitter
100 method
105 output block
110 block
120 block
130 block
140 block
145 block
150 block
160 method
200 OLED device
210 subpixel
220 subpixel
230 subpixel
140 subpixel
250 OLED device
260 subpixel
270 subpixel
280 subpixel
290 subpixel
300 substrate
320b subpixel
320g subpixel Parts List cont'd
320r subpixel
320w subpixel
360 interpixel dielectric layer
381 first electrode
400 active matrix circuitry layers
402 insulating layer
404 insulating layer
407 insulating layer
410 organic EL media
411 hole injecting layer
412 hole transporting layer
413 light-emitting layer
414 electron transporting layer
420 second electrode
430r color filter
430g color filter
430b color filter
430w transparent filler
480b light emission
480g light emission
480r light emission
480w light emission

The invention claimed is:

1. A method for making an OLED device, comprising:
   (a) providing a plurality of subpixels of different colors, including at least three gamut-defining subpixels, each subpixel requiring an operating voltage which is based on the maximum current density required by that subpixel;
   (b) selecting the display operating voltage to be equal to or greater than the maximum required subpixel operating voltage; and
   (c) selecting the area of the subpixels to reduce the maximum required subpixel operating voltage, thereby reducing the display operating voltage so as to reduce power consumption in the device.

2. A method for making an OLED device, comprising:
   (a) providing a plurality of subpixels of different colors, including at least three gamut-defining subpixels and one within-gamut subpixel, each subpixel requiring an operating voltage which is based on the maximum current density required by that subpixel;
   (b) selecting the display operating voltage to be equal to or greater than the maximum required subpixel operating voltage; and
   (c) selecting the area of the subpixels to reduce the maximum required subpixel operating voltage, thereby reducing the display operating voltage so as to reduce power consumption in the device.

3. The method of claim 2 wherein the gamut-defining subpixels emit red, green and blue light.

4. The method of claim 3 wherein the within-gamut subpixel emits white light.

5. The method of claim 4 wherein the OLED device is a white-light-emitting OLED device and the gamut-defining subpixels each include a color filter so as to provide the red, green, and blue light.

6. The method of claim 2 wherein the areas of the subpixels are further selected to improve lifetime.

7. The method of claim 6 wherein the gamut-defining subpixels emit red, green and blue light.

8. The method of claim 7 wherein the within-gamut subpixel emits white light.

9. The method of claim 8 wherein the OLED device is a white-light-emitting OLED device and the gamut-defining subpixels each include a color filter so as to provide the red, green, and blue light.

* * * * *